United States Patent [19]
Bower

[11] Patent Number: 4,749,661
[45] Date of Patent: Jun. 7, 1988

[54] VERTICAL SLOT BOTTOM BIPOLAR TRANSISTOR STRUCTURE

[75] Inventor: Robert W. Bower, Kihei, Hi.

[73] Assignee: Advanced Micro Devices, Inc., Sunnyvale, Calif.

[21] Appl. No.: 897,686

[22] Filed: Aug. 18, 1986

Related U.S. Application Data

[63] Continuation-in-part of Ser. No. 576,659, Feb. 3, 1984, abandoned.

[51] Int. Cl.$^4$ ............... H01L 21/31; H01L 21/76
[52] U.S. Cl. .................................. 437/33; 437/67; 357/34; 357/55
[58] Field of Search ............... 148/DIG. 10, DIG. 11; 357/55, 34; 437/31, 33

[56] References Cited

U.S. PATENT DOCUMENTS

| | | | |
|---|---|---|---|
| 3,681,668 | 8/1972 | Kobayashi | 357/59 |
| 3,703,420 | 11/1972 | Vora | 357/35 |
| 3,762,966 | 10/1973 | Engeler et al. | 357/36 |
| 4,062,034 | 12/1977 | Matsushita et al. | 357/16 |
| 4,104,086 | 8/1978 | Bondur et al. | 357/50 |
| 4,139,442 | 2/1979 | Bondur et al. | 357/50 |
| 4,302,763 | 11/1981 | Ohuchi et al. | 357/59 |
| 4,339,767 | 7/1982 | Horng et al. | 357/44 |
| 4,392,149 | 7/1983 | Horng et al. | 357/59 |
| 4,419,150 | 12/1983 | Soclof | 357/35 |
| 4,484,211 | 11/1984 | Takemoto et al. | 357/50 |
| 4,674,173 | 6/1987 | Hahn et al. | 357/34 |

FOREIGN PATENT DOCUMENTS

| | | | |
|---|---|---|---|
| 0068072 | 5/1983 | European Pat. Off. | 357/50 |
| 3400295 | 7/1984 | Fed. Rep. of Germany | |
| 54-116884 | 9/1979 | Japan | 357/50 |
| 57-11150 | 3/1982 | Japan | 357/50 |
| 57-201070 | 9/1982 | Japan | 357/50 |

OTHER PUBLICATIONS

Lillja et al, "Process for Fabrication of Shallow and Deep Silicon Dioxide Filled Trenches", *IBM Technical Disclosure Bulletin*, vol. 22, No. 11, Apr. 1980, pp. 4900–4902.

Wang et al, "Reactive-Ion Etching Eases Restrictions on Materials and Feature Sizes", *Electronics*, Nov. 3, 1983, pp. 157–161.

Minegishi et al, "A Sub-Micron CMOS Megabit Level Dynamic Ram Technology Using a Doped Face Trench Capacitor Cell", *Proceedings*, IEDM, 1983, pp. 319–322.

Morie et al, "Depletion Trench Capacitor Technology for Megabit Level MOS dRAM" *IEEE EDL*, vol. ED-L-4, No. 11, Nov., 1983, pp. 411–413.

*Primary Examiner*—Olik Chaudhuri
*Attorney, Agent, or Firm*—Patrick T. King; John P. Taylor; J. Vincent Tortolano

[57] ABSTRACT

An improved bipolar slot transistor vertically formed in a slot in an integrated circuit structure is disclosed. The transistor is formed in a substantially vertical slot having an active base region formed beneath the bottom of the slot and comprises an active collector region formed beneath the active base region, a buried collector layer beneath the active collector region and in communication with a collector contact; an emitter region formed in the slot over the active base region; and extrinsic base regions formed adjacent to but insulated from the sidewalls of the slot communicating with the active base region and with base contact regions on the surface of the structure.

13 Claims, 12 Drawing Sheets

VERTICAL SLOT BOTTOM BIPOLAR TRANSISTOR STRUCTURE

CROSS-REFERENCE TO RELATED APPLICATIONS

This application is a continuation-in-part of Bower U.S. patent application Ser. No. 576,659 filed Feb. 3, 1984, now abandoned.

BACKGROUND OF THE INVENTION

1. Field of the Invention

This invention relates to a bipolar transistor formed in a slot. More particularly, this invention relates to formation of a vertical bipolar transistor made in a slot in an integrated circuit substrate.

2. Discussion of the Prior Art

Advances in lithography have permitted line width resolution to reach micron dimensions and processing techniques have improved to the point where the reliable formation of thin films and precise etching are both possible so that smaller and more predictable feature sizes can be obtained. As a consequence, the lateral dimensions of devices are reaching micron levels and passing on into nanometer ranges resulting in a continued decrease in the ensuing density of integrated circuits.

Thus, a greater number of individual devices can be fabricated in a given area. While further increases in areal density are likely, physical, equipment, and process limits are being approached. In addition, as devices become smaller and smaller, their power ratings are reduced and the relative importance of problems such as parasitic capacitance and contamination is increased. Due to the diminishing return to be obtained from further efforts to improve areal density, it has become desirable to consider the possibility of increasing the extent of the active regions in the vertical dimension to thereby obtain performance for a device with established lateral dimensions which is equivalent to the performance of a device with greater lateral dimensions. Also higher power or higher performance devices may be obtained in this way.

As the densities of integrated circuits have increased, there has been serious consideration of using trench or slot formation processes for forming the insulating zones between individual transistors. Such an isolation technique is described in Bondur et al U.S. Pat. No. 4,104,086 as well as in Bonn U.S. patent Ser. No. 719,085 and Gwozdz U.S. patent application Ser. No. 759,621, both of which applications are assigned to the assignee of this application.

In addition to forming slots in semiconductor wafers for isolating individual devices, slots have also been considered for use as passive circuit elements. For example, it has been proposed that a slot be filled with an appropriate material so that it will function as a capacitor. See, e.g., K. Minegishi et al., "A Sub-Micron CMOS Megabit Level Dynamic RAM Technology Using a Doped Face Trench Capacitor Cell", *Proceedings*, IEDM, 1983, p. 319; and T. Morie et al., "Depletion Trench Capacitor Technology for Megabit Level MOSdRAM", *IEEE Electron Device Letters*, v. EDL-4, No. 11, p. 411, November 1983. Such applications are possible because with appropriate filling materials a slot can be made to be conductive or insulating as required.

It has also been proposed to construct active devices in slots in a substrate. Fujitsu Japanese Patent Document No. 57-11150 discloses construction of a lateral bipolar transistor wherein an emitter region is formed by diffusing impurities into the walls of a slot formed in a substrate. A collector region is similarly formed using a slot formed in the substrate adjacent the first slot. The substrate portion between the emitter region and the collector region is said to form the base of the transistor.

In my parent application Ser. No. 576,659, assigned to the assignee of this invention and cross-reference to which is hereby made, I described and claimed the construction of a bipolar transistor in a slot in a substrate wherein a base region is first formed in the substrate walls and bottom of a first slot which is filled with a substance which will form an emitter in the slot to thereby provide a self-aligned structure with a large base-emitter surface junction. Carrier transport occurs both laterally and vertically between the emitter in the slot and the surrounding base. A second slot, providing a collector contact region, is formed in alignment with the emitter slot. A buried collector layer, located beneath the portion of the base region formed in the substrate beneath the emitter slot, communicates with the collector contact region.

Such a construction results in a high performance device having lower collector-to-base and collector-to-substrate capacitances due to the respective relationships between the physical collector and base regions and the active collector and base regions.

However, it would be desirable to construct a high performance bipolar transistor in a slot which would allow a double-sided base contact for reduced intrinsic base resistance (Rbi) and which would permit the use of an implanted collector and base in combination with a buried layer connecting the collector with a collector contact to optimize collector up down resistance, i.e., the parasitic resistance the current sees in the collector node, as well as to optimize base profile for forward transit time considerations.

SUMMARY OF THE INVENTION

It is, therefore, an object of this invention to provide an improved slot transistor having an active base region formed beneath a slot in a substrate and an active collector region formed beneath the active base region.

It is another object of this invention to provide an improved slot transistor having an active base region implanted beneath a slot in a substrate and an active collector region implanted beneath the active base region to optimize collector up down resistance and provide faster forward transit times.

It is yet another object of this invention to provide an improved slot transistor having an active base region implanted beneath a slot in a substrate and an active collector region implanted beneath the active base region with a double sided base contact provided to reduce Rbi.

These and other objects of the invention will be apparent from the following description and accompanying drawings.

In accordance with the invention, an improved bipolar transistor formed in a slot in an integrated circuit structure comprises a substantially vertical slot having an active base region formed beneath the bottom of the slot; an active collector region formed beneath the active base region, a buried collector layer beneath the active collector region and in communication with a collector contact; an emitter region formed in the slot over the active base region; and extrinsic base regions formed adjacent to but insulated from the sidewalls of the slot and communicating with base contact regions on the surface of the structure.

DESCRIPTION OF THE PREFERRED EMBODIMENTS

Figure 1:
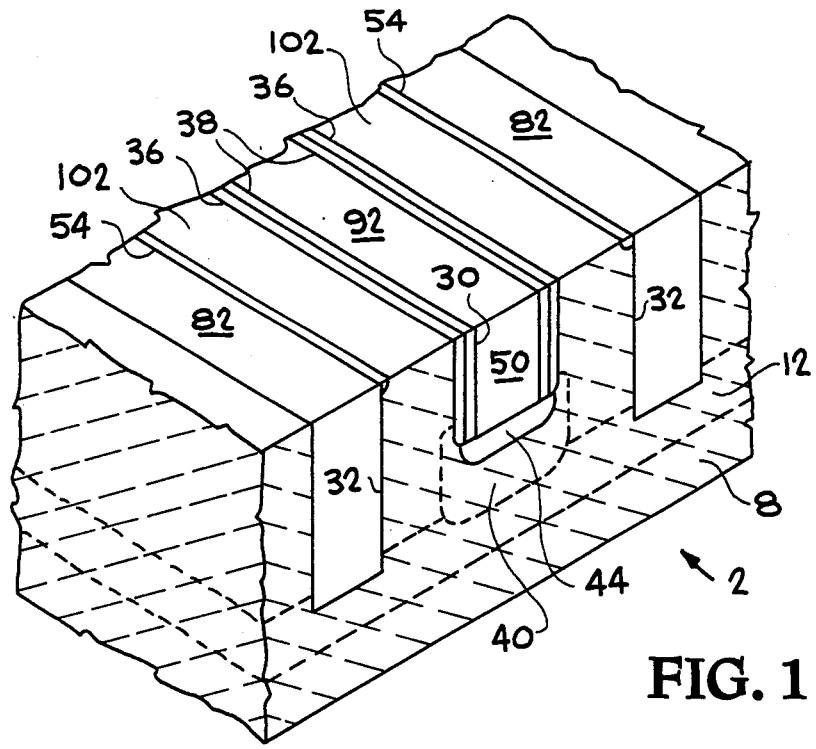
FIG. 1 is a partially cutaway isometric view of the bipolar transistor structure of the invention.
Figure 2:
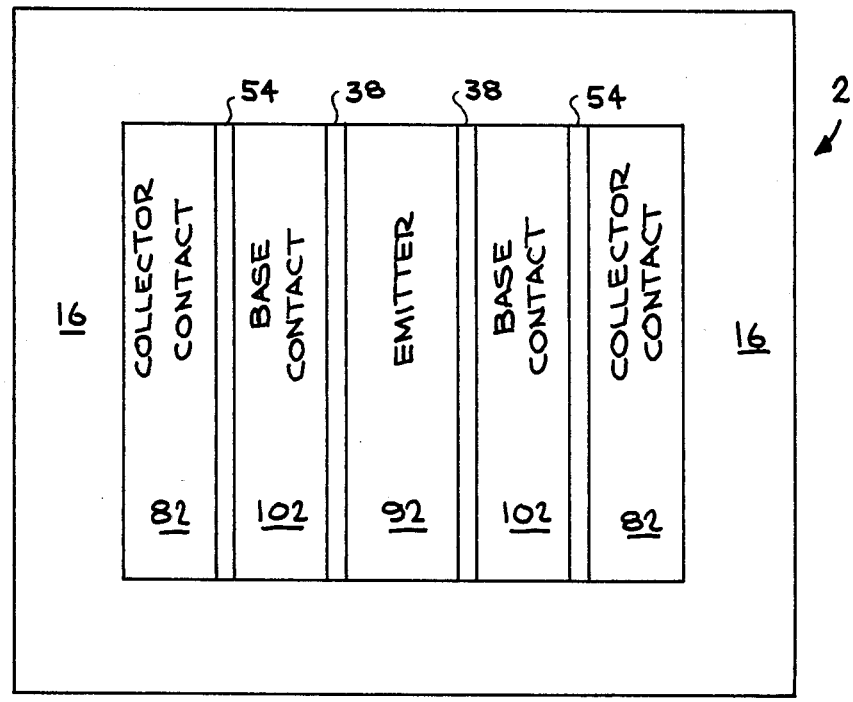
FIG. 2 is a plan view of the bipolar transistor structure of FIG. 1.

Referring to FIGS. 1 and 2, the bipolar transistor structure of the invention, generally illustrated at 2, is formed vertically in the bottom of a slot 30 in a substrate 8 and hence is referred to herein as a "slot bottom" transistor. The slot bottom transistor comprises an active collector region 40, which is formed in substrate 8 below the bottom of slot 30; an intrinsic base region 44 which is formed over collector region 40 in substrate 8, but also below the bottom of slot 30; and an emitter region 50 which is formed in slot 30 over base 44.

Base contact 102 provides contact to active base region 44 through extrinsic base regions 36 formed in substrate 8 adjacent slot 30. Contact is made to collector region 40 through one or more separate collector contact slots 32 formed in substrate 8 parallel to slot 30 and coupled to collector region 40 by a buried collector layer 12 comprising a portion of substrate 8.

As further shown in FIG. 2, an isolation oxide 16 may be formed around the contacts to separate the contacts from adjacent devices in the substrate. Alternatively, a walled isolation slot may be formed around the device as described and claimed in my copending U.S. patent application Ser. No. 897,685, entitled "WALLED SLOT DEVICES AND METHOD OF MAKING SAME", filed on Aug. 18, 1986, and assigned to the assignee of this invention.

By way of illustration, and not of limitation, the slot bottom transistor of the invention will be illustrated as constructed using silicon semiconductor material, i.e., single crystal silicon, polysilicon, and oxides of silicon. It will be understood, however, that such a device could be constructed using other semiconductor materials.

The slot in which slot bottom transistor 2 is constructed is formed in semiconductor substrate 8 which, in turn, comprises a single crystal silicon which has been N+ doped to form a conductive region 12 in the surface thereof and a silicon layer 14 which is epitaxially grown over doped region 12 to thereby form doped region 12 into a buried collector layer.

Turning now to FIGS. 3-18, step by step construction of the bipolar transistor of the invention will be described.

Figure 3:
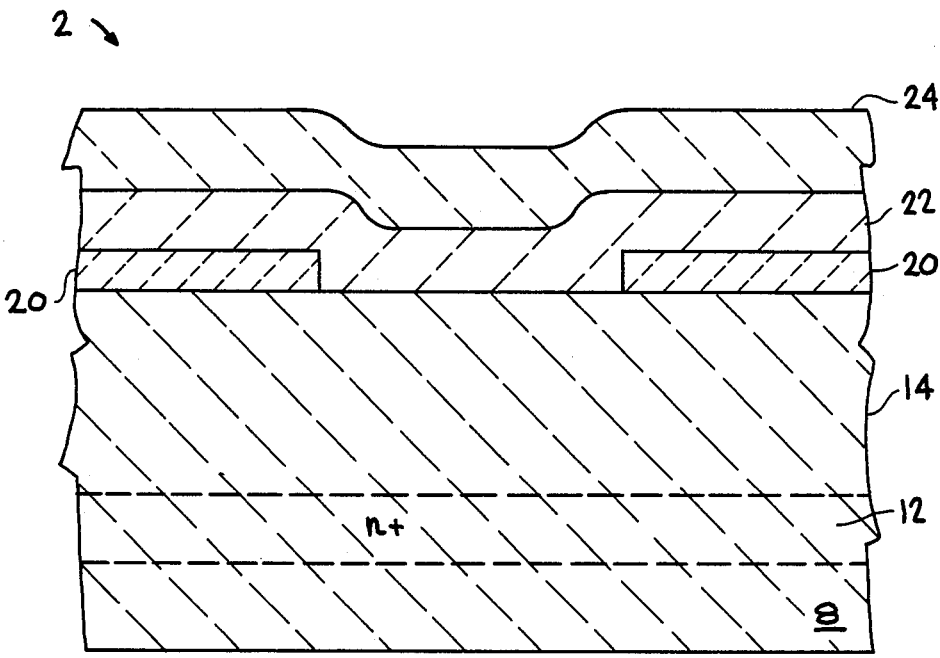
FIGS. 3-18 are vertical cross-sectional views illustrating the step by step construction of the slot bottom bipolar transistor structure of the invention.
Figure 4:
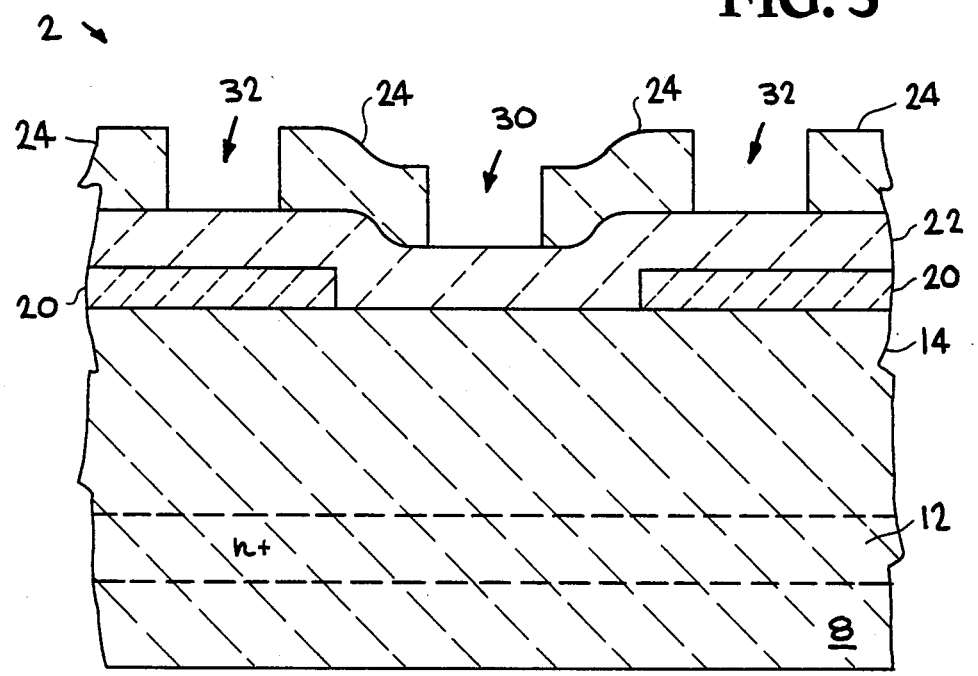

Referring now to FIG. 3, a nitride mask 20 is defined over epitaxial silicon layer 14 and a layer 22 of polysilicon is deposited over nitride mask 20 and the exposed portions of silicon layer 14. An oxide layer 24 is then formed over polysilicon layer 22. Oxide layer 24 is then masked and etched, as shown in FIG. 4, to define, respectively, the latent image of the emitter-base-collector slot 30 and the collector contact slots 32.

Figure 5:
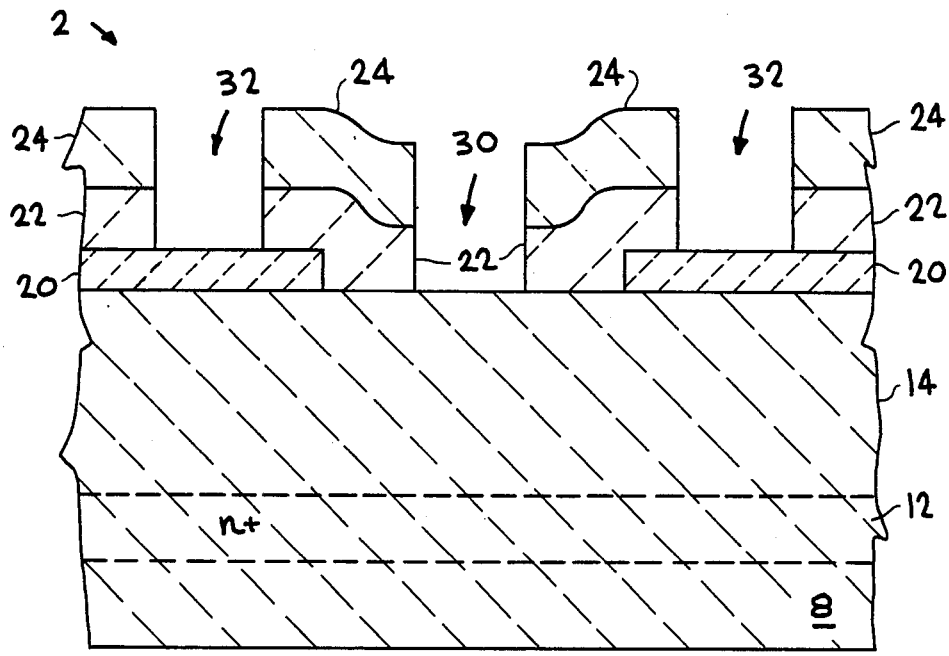
Figure 6:
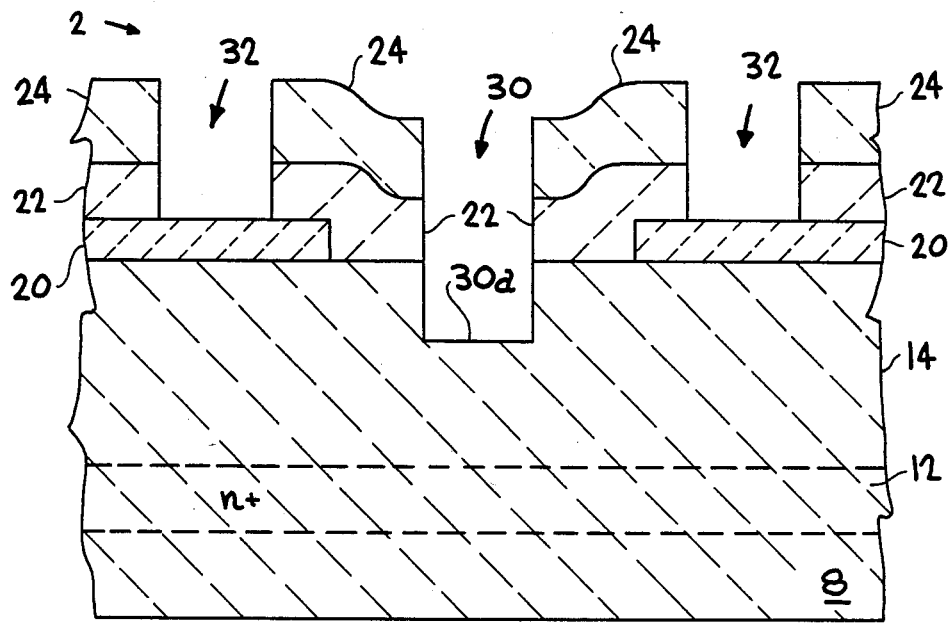

In FIG. 5, slots 30 and 32 have been etched through polysilicon layer 22 with a selective anisotropic ion etch for polysilicon utilizing $Cl_2$, $H_2$, and $SiCl_4$. Nitride mask 20 acts as an etch block to stop further etching of slot 32 while slot 30 is then further etched into silicon 14 to a depth of about 0.25 to 3.0 microns as shown at 30a in FIG. 6 using an anisotropic silicon ion etch.

It should be noted here that a single merged slot may be used to form the collector, and the base and emitter regions as described and claimed in copending application Ser. No. 897,678, entitled "INTEGRATED CIRCUIT STRUCTURE WITH ACTIVE DEVICE IN MERGED SLOT AND METHOD OF MAKING SAME", filed on Aug. 18, 1986 and assigned to the assignee of this invention.

Figure 7:
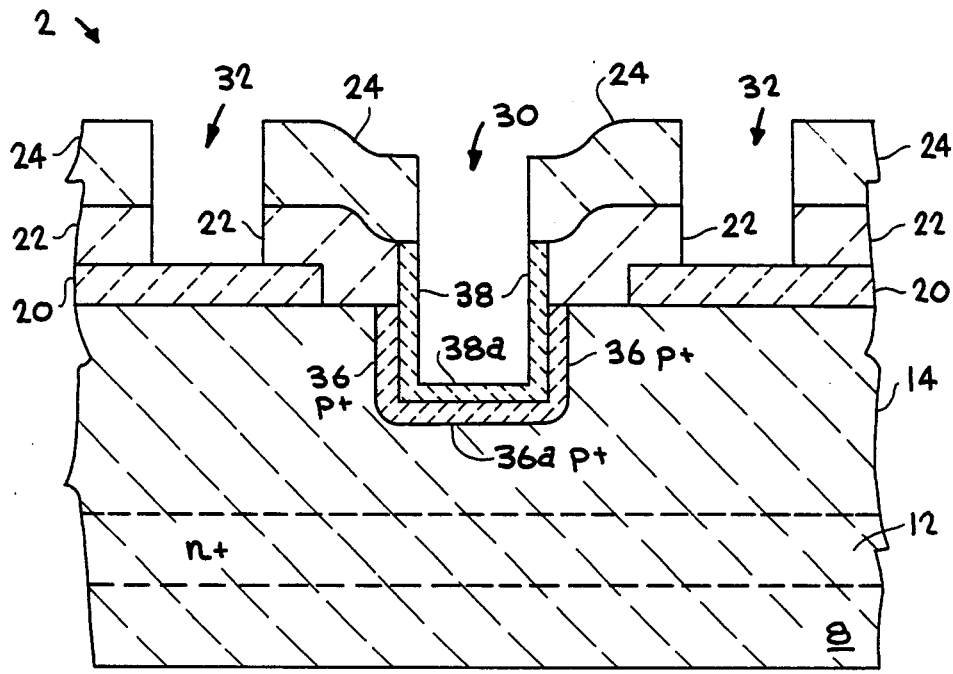
Figure 8:
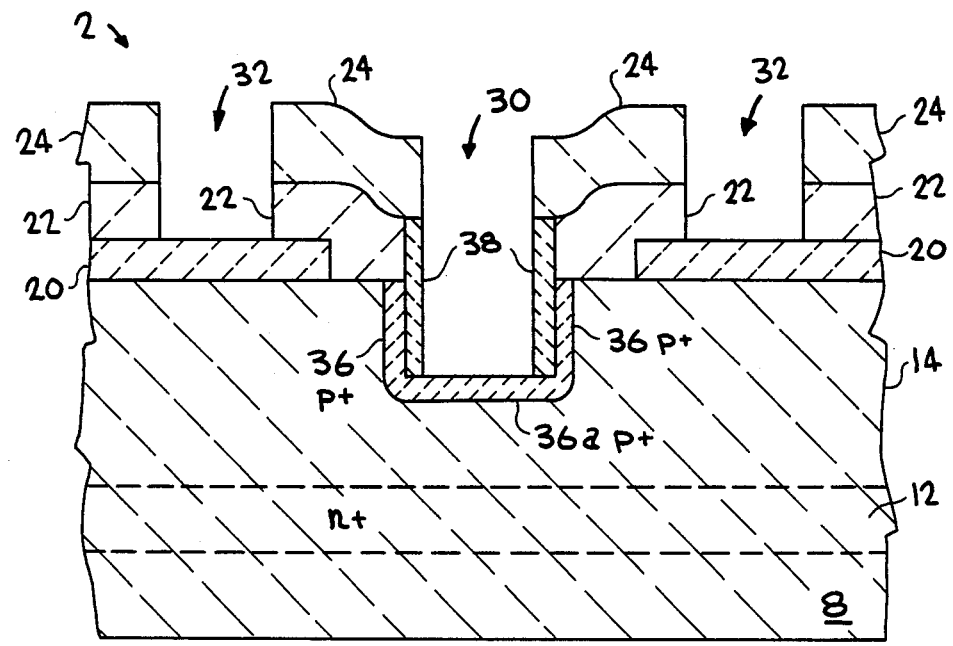
Figure 9:
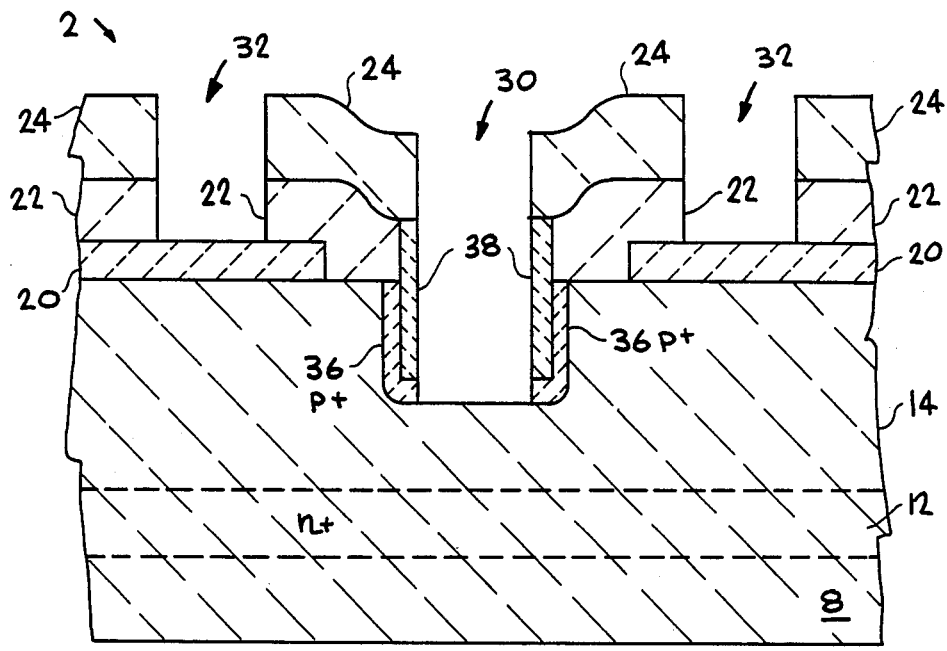

The exposed sidewall and bottom of slot 30 are then P+ doped by diffusing boron as shown at 36 and 36a in FIG. 7. The doped sidewall and bottom of slot 30 are then oxidized at 38 and 38a. The bottom of slot 30 is then etched with a reactive ion etch (RIE) to first remove oxide portion 38a, as shown in FIG. 8, and then to remove P+ doped silicon portion 36a resulting in the structure of FIG. 9. The remaining doped portions 36 will form extrinsic base regions to connect the active base yet to be formed with contacts at the surface as will be described.

Figure 10:
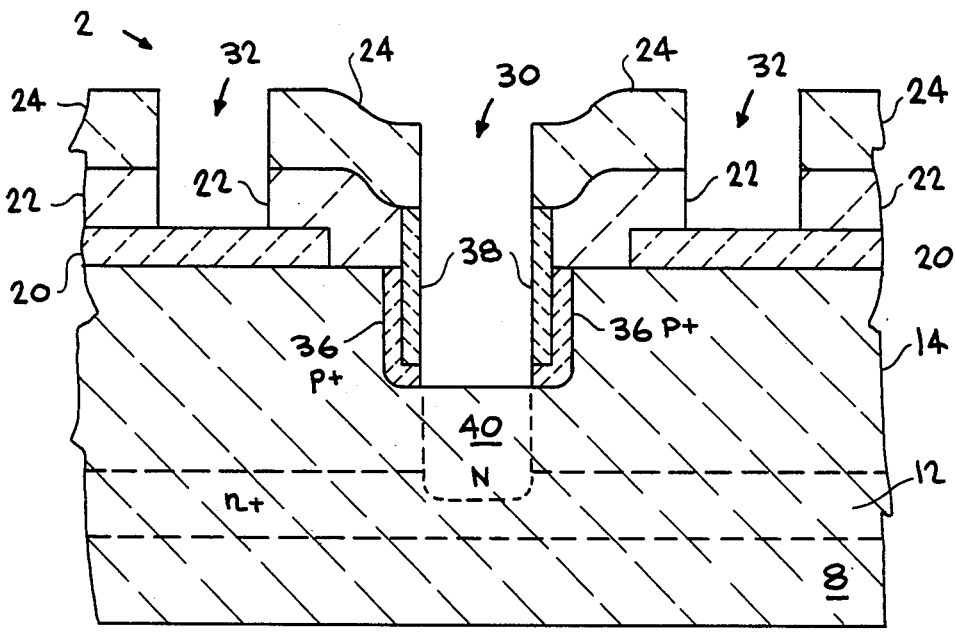
Figure 11:
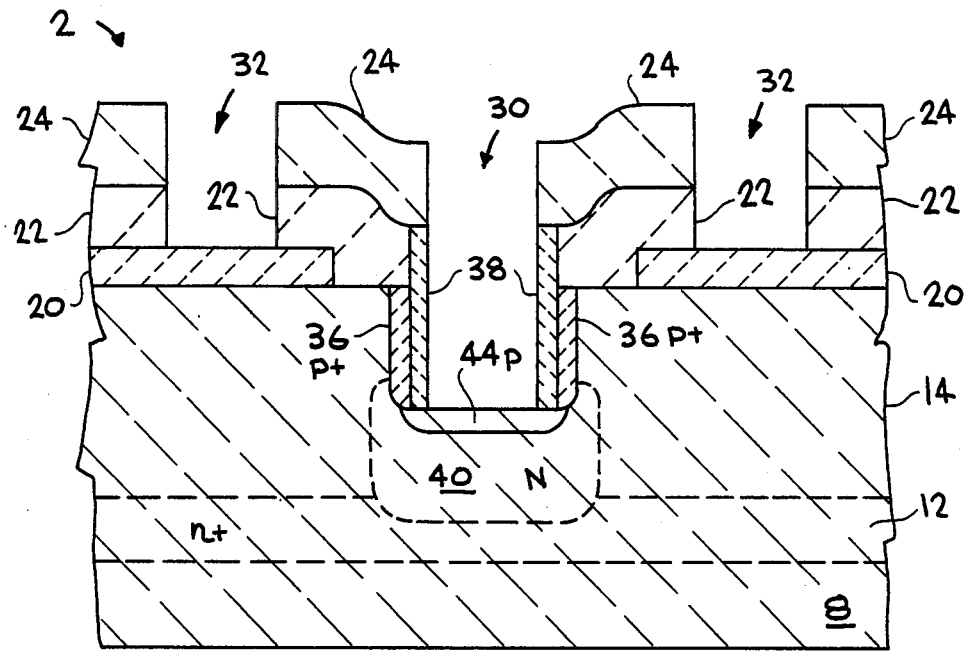

An N collector region 40 and a P intrinsic base region 44 are now formed in silicon layer 14 beneath the bottom of slot 30 by implantation and diffusion. Arsenic ions, at an energy level of 180 KeV, are first implanted to provide the N doping for the collector, as seen in FIG. 10, followed by P doping by implantation of boron ions at an energy level of 30 KeV. Collector region 40 and intrinsic base region 44 are then annealed at 950° C. for 30 minutes as shown in FIG. 11.

The collector/base diffusions may also be designed so the collector diffusion does not contact extrinsic base 36 by limiting the extent of the extrinsic vertical base and then implanting the intrinsic base, driving the intrinsic base around the corner of the base-emitter slot to contact the extrinsic base which thereby reduces the collector base capacitance.

It will be noted that the implantation energy and diffusion to form collector region 40 must be sufficient to penetrate through layer 14 down to buried collector layer 12 to thereby provide eventual electrical contact between active collector region 40 and collector contacts as will be described.

Figure 12:
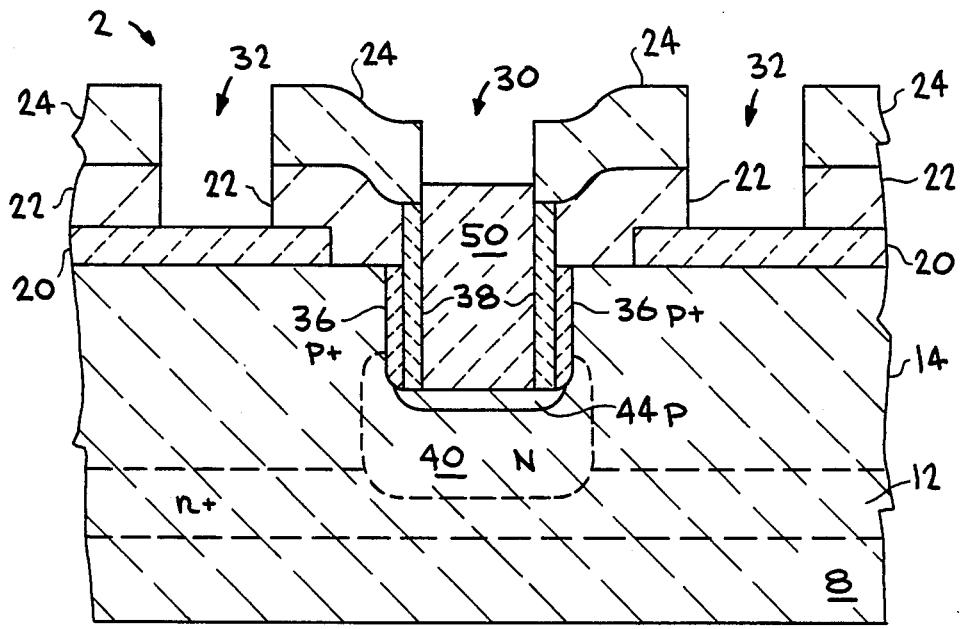
Figure 13:
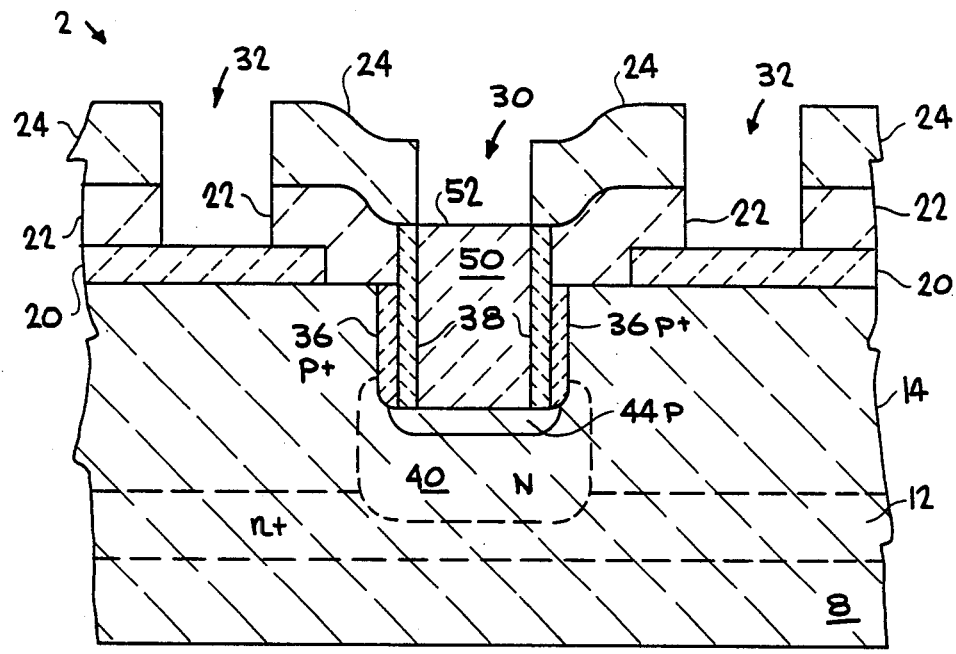
Figure 14:
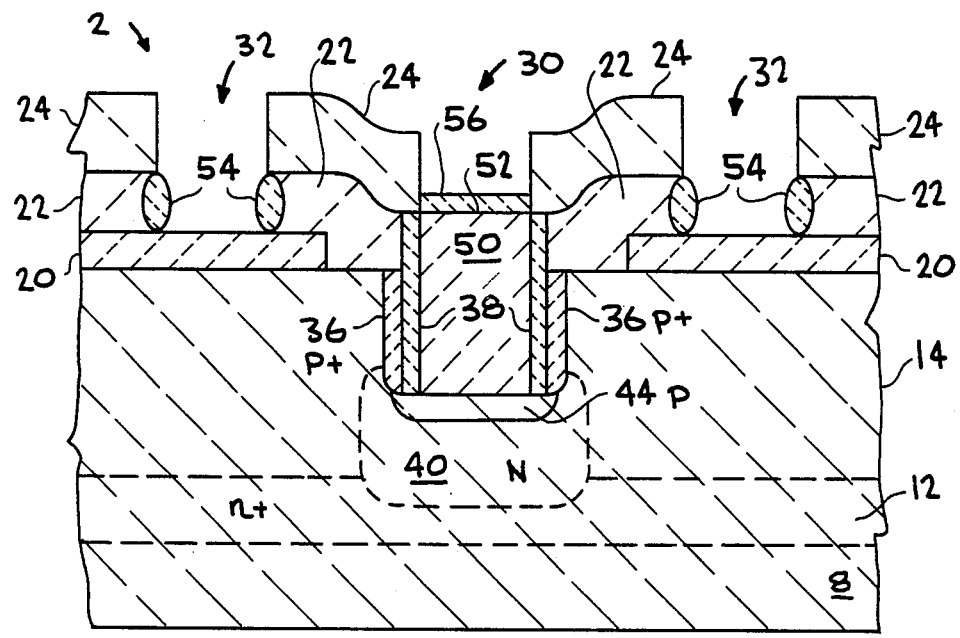

After formation of active collector region 40 and intrinsic base region 44, emitter slot 30 may be filled with N doped polysilicon or SIPOS 50 as shown in FIG. 12 and then planarized to a level 52 by appropriate planarization techniques as shown in FIG. 13.

Turning now to FIGS. 14-18, contact to active collector region 40 is made via buried collector layer 12 by completion of collector contact slots 32. Prior to completion of slots 32, protective oxide portions 54 are grown on the exposed edges of polysilicon layer 22 to isolate extrinsic base contact region 22 from the collector contact material which will eventually be deposited into slots 32. At the same time, oxide portion 56 is formed over polysilicon emitter 50 as shown in FIG. 4 to provide an etch mask for polysilicon emitter 50 during subsequent etching of silicon layer 14 to complete formation of slots 32.

Figure 15:
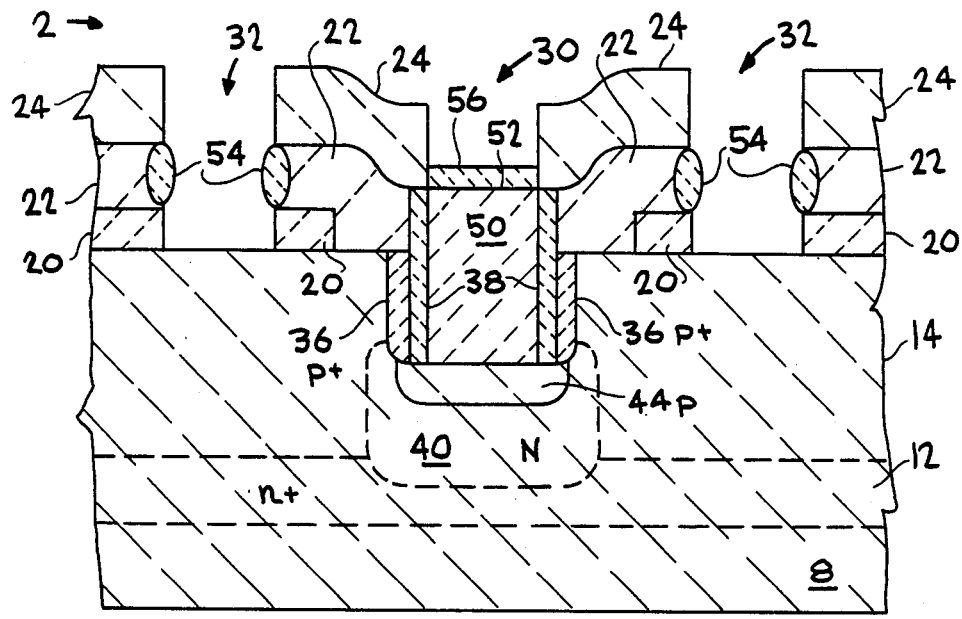
Figure 16:
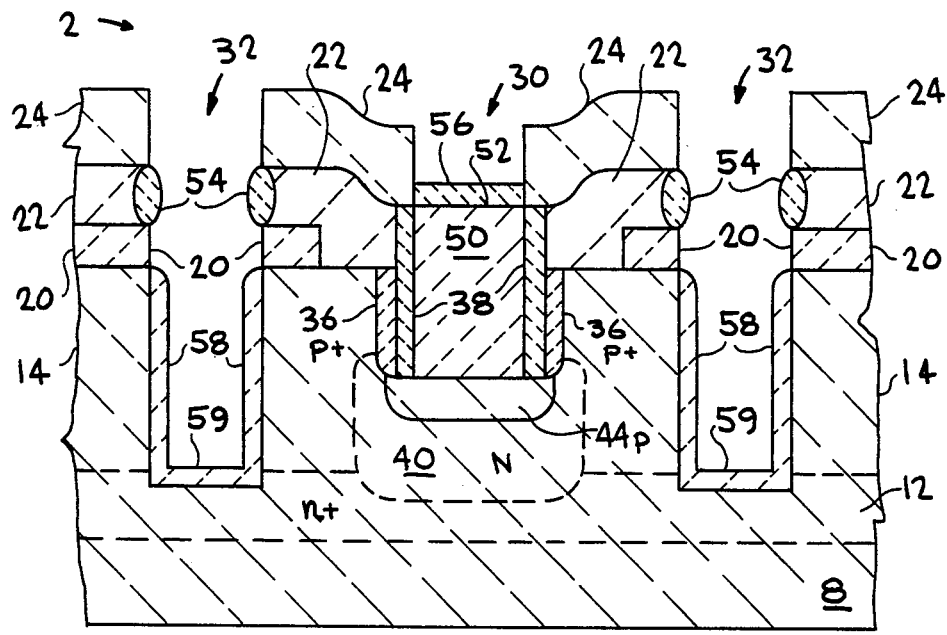

After formation of oxide portions 54 and 56, the exposed portions of nitride layer 20 in slots 32 are removed as illustrated in FIG. 15 and slots 32 are etched through silicon layer 14 and into buried collector layer 12 as seen in FIG. 16.

A layer of oxide is then grown on the exposed silicon surfaces of slots 32 at 58 and 59 to provide insulation on the sidewalls of slot 32 to electrically insulate the collector contact material to be placed in slots 32 from the nearby extrinsic base regions 36. After formation of oxide 58 and 59, protective oxide portion 56 may then removed from polysilicon emitter 50 as well as oxide 59 from the bottom of slots 32 to permit electrical contact to buried collector layer 12.

Figure 17:
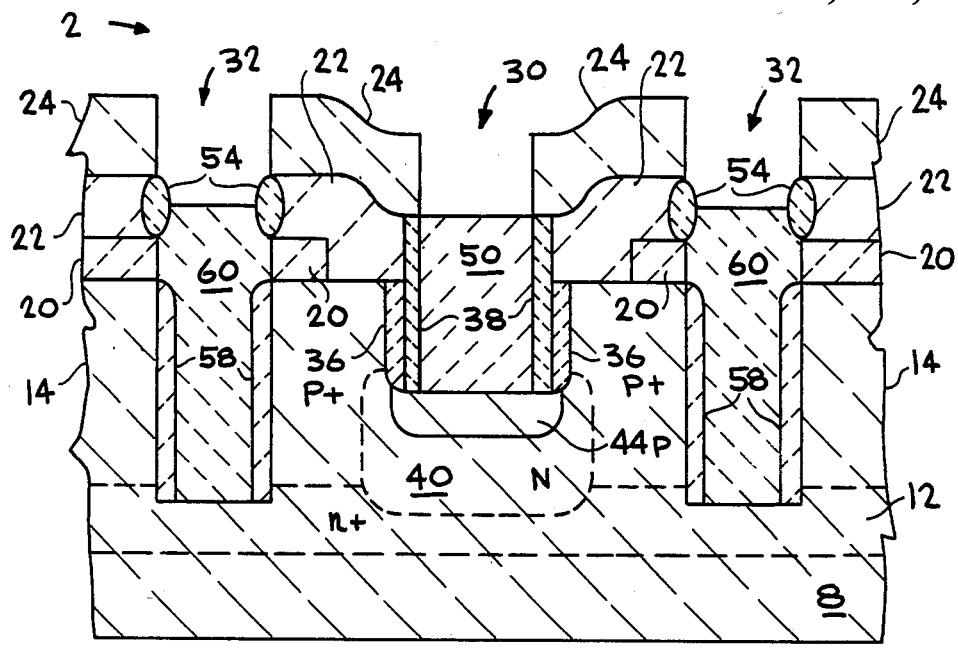
Figure 18:
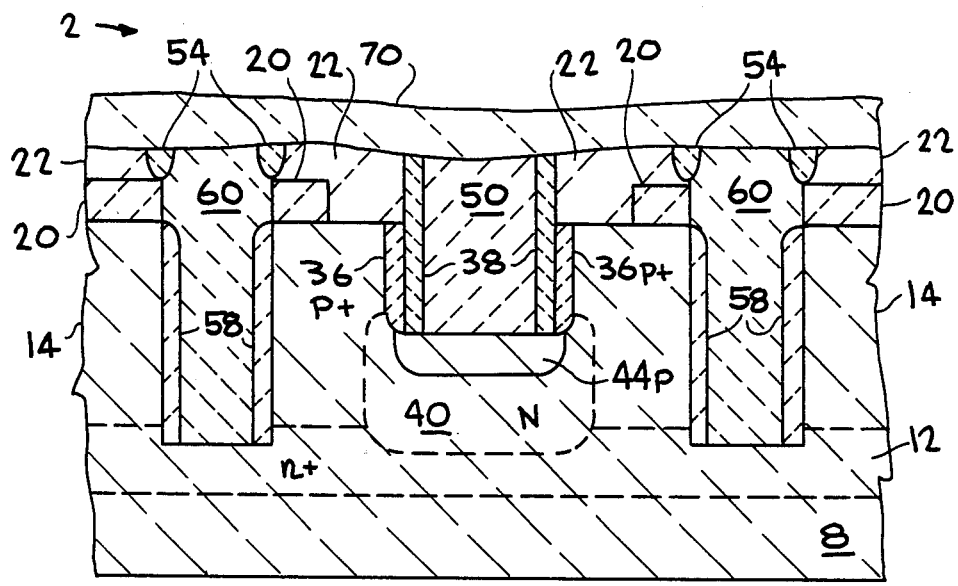
Figure 19:
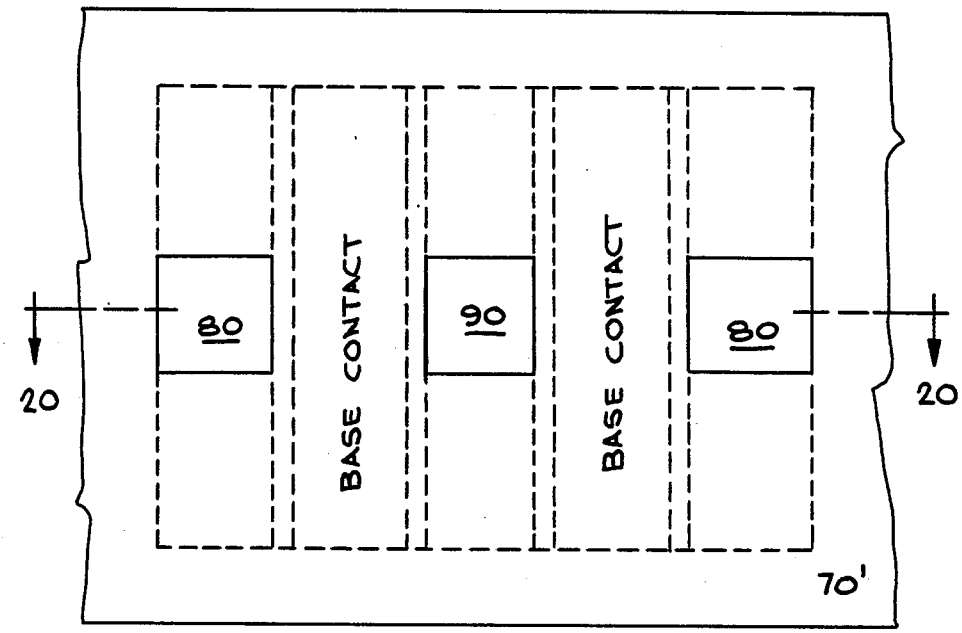
FIG. 19 is a plan view illustrating the position of the openings formed to the emitter and collector contacts.
Figure 20:
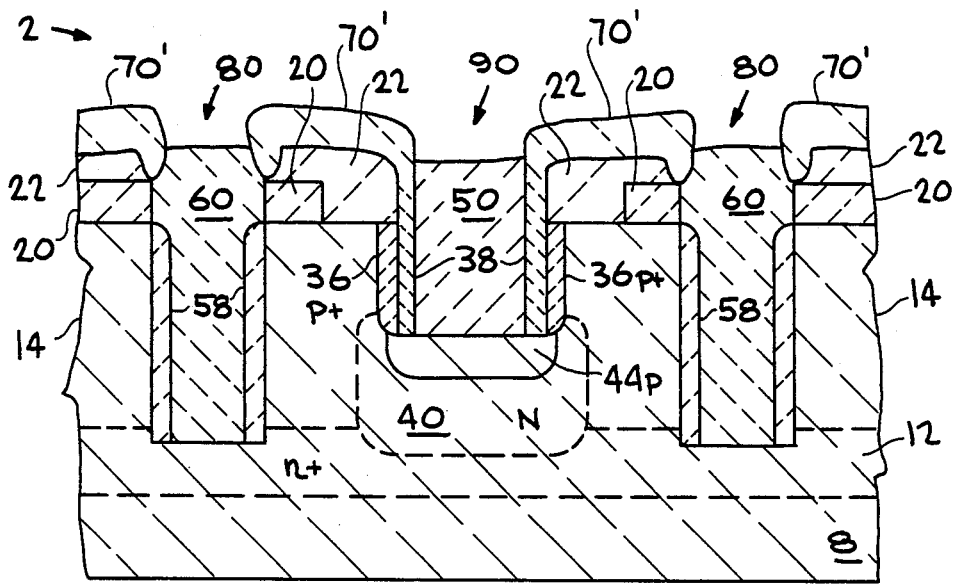
FIG. 20 is a vertical side-section view of the structure of FIG. 19 taken along lines 20—20.

Collector contact slots 32 are then filled with an appropriate conductive material such as doped polysilicon 60 as shown in FIG. 17 prior to formation of the respective metal contacts. A layer of oxide 70 may then be deposited or grown over the structure as shown in FIG. 18 which is then masked to form the latent images, respectively, of the collector contact and emitter slots as shown at 80 and 90 in FIGS. 19 and 20.

Figure 21:
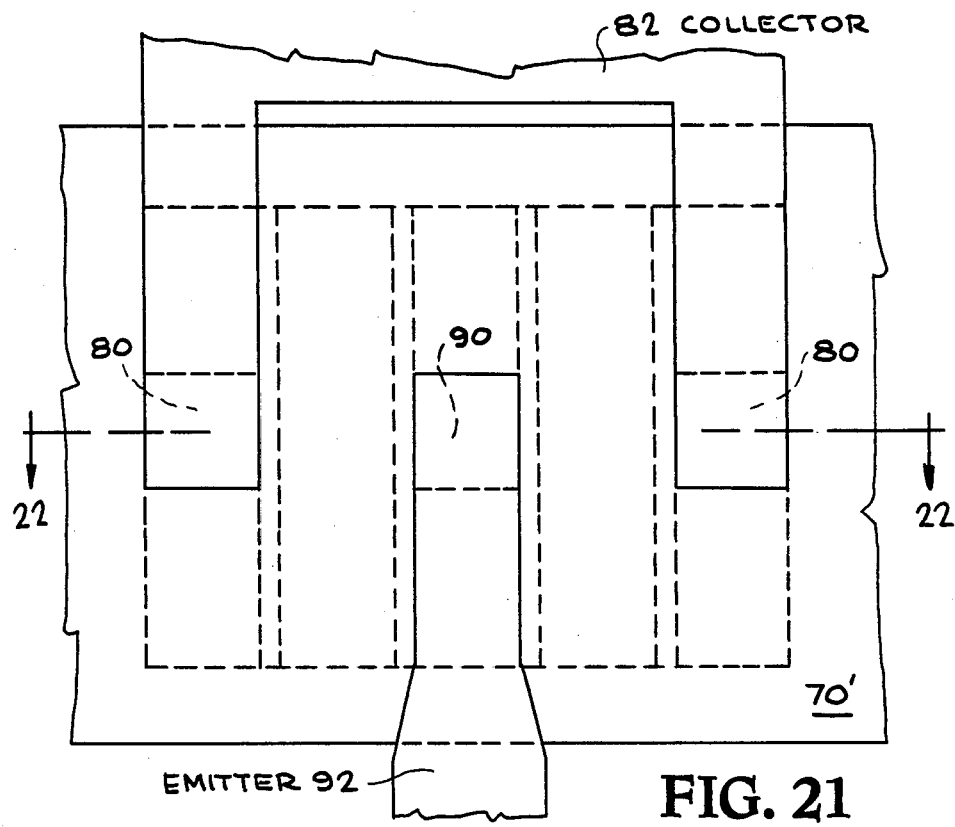
FIG. 21 is a plan view illustrating formation of the emitter and collector electrodes.
Figure 22:
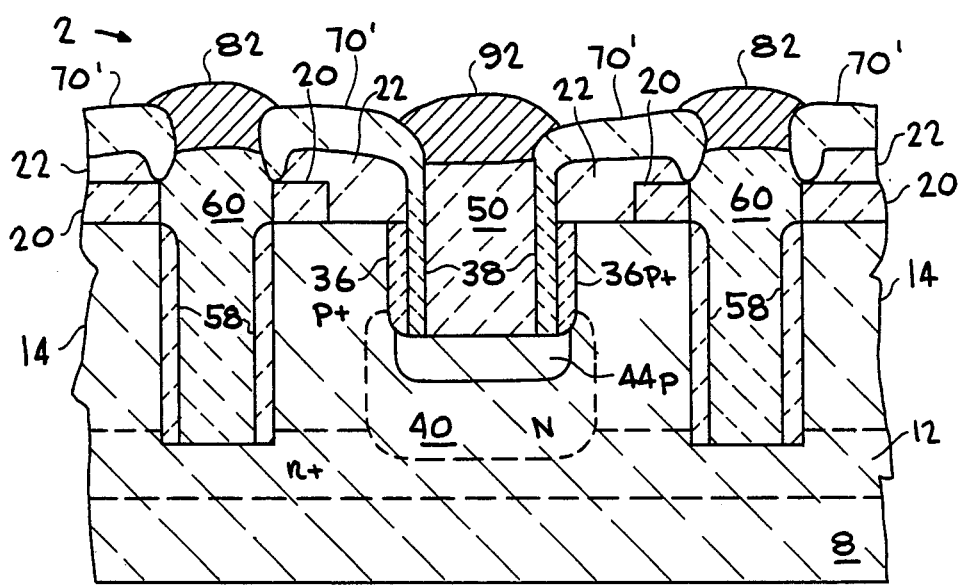
FIG. 22 is a vertical side-section view of the structure of FIG. 21 taken along lines 22—22.

A metal layer may then be formed over oxide portions 70' which remain after patterning of oxide layer 70 and masked and etched to form metal collector electrode 82 and emitter electrode 92 as seen in FIGS. 21 and 22.

Figure 23:
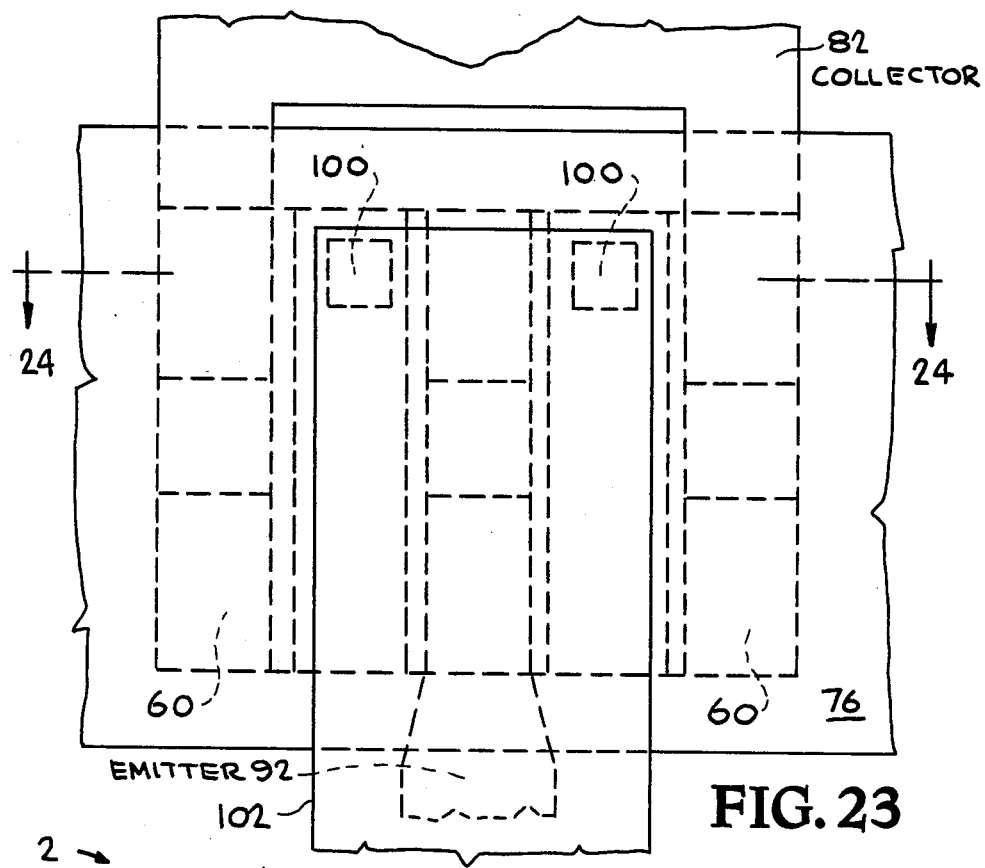
FIG. 23 is a plan view illustrating formation of the base electrode.
Figure 24:
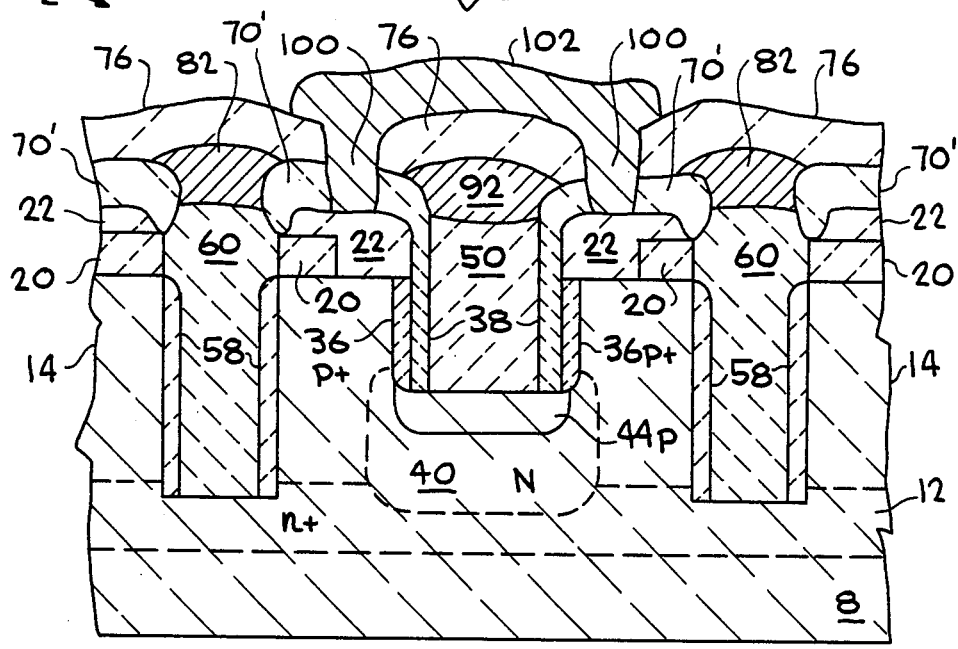
FIG. 24 is a vertical side-section view of the structure of FIG. 23 taken along lines 24—24.

An oxide layer 76 may then be formed over electrodes 82 and 92 and patterned to form openings to base portions 22 through oxide 76 and underlying oxide 70'. A metal layer may then be applied and patterned to form base electrode 102 as shown in FIGS. 23 and 24.

Metallized contacts may also be made to polysilicon portions 22, 50, and 60 to provide respective contacts to the base, emitter, and collector by the means shown in FIGS. 18-24 of my parent U.S. patent application Ser. No. 576,659. Other conventional contact schemes may also be used to provide external electrical contact to polysilicon base contact region 22, emitter 50, and collector contact 60 as is well known to those skilled in the art and which does not necessarily form a part of the present invention.

Thus the invention provides a vertical bipolar transistor in the bottom of a slot having a double sided base contact for reduced Rbi and an implanted collector and base vertically formed beneath the emitter in a common slot to optimize collector up down resistance and base profile for forward transit time considerations.

Having thus described the invention, what is claimed is:

1. A method of making an improved bipolar transistor in a slot in an integrated circuit structure which comprises:
    (a) forming a first substantially vertical slot in an integrated circuit structure;
    (b) forming an active collector region in said substrate beneath the bottom of said first slot;
    (c) forming an active base region in said substrate in a portion of said active collector region formed beneath the bottom of said slot;
    (d) providing electrical contact means to said active collector region;
    (e) forming an emitter region in said first slot over said active base region;
    (f) forming a plurality of extrinsic base regions adjacent to but insulated from the sidewalls of said first slot and contiguous with said active base region; and
    (g) forming base contact regions on the surface of said structure and in electrical communication with said extrinsic base regions.

2. The method of claim 1 wherein said step of forming said plurality of extrinsic base regions further comprises doping the sidewalls of said first slot.

3. The method of claim 2 wherein said step of doping said sidewalls of said first slot to form said extrinsic base regions is carried out prior to said implantation steps to form said active base region and said active collector region.

4. The method of claim 2 including the further step of forming an insulating layer on the sidewalls of said first slot after forming said extrinsic base regions and prior to said implantation steps.

5. The method of claim 1 including the further step of diffusing said implanted doping agents into said substrate to form said active base region and said active collector region.

6. The method of claim 1 wherein said step of providing electrical contact means to said active collector region includes the step of forming a buried collector layer beneath said active collector region.

7. The method of claim 6 wherein said step of providing electrical contact means to said active collector region further includes the step of forming one or more collector contact slots in said structure parallel to said first slot and extending down to said buried collector layer and filling said one or more slots with conducting material capable of providing electrical contact to said buried collector layer and thereby to said active collector region.

8. The method of claim 7 including the further step of providing an insulating layer on the sidewalls of said one or more collector contact slots to electrically isolate said conducting material from adjacent base regions.

9. A method of making an improved bipolar transistor in a slot in an integrated circuit structure which comprises:
    (a) forming a buried collector layer in said structure;
    (b) forming a first substantially vertical slot in an integrated circuit structure having a depth less than the depth of said buried collector layer;
    (c) doping said substrate adjacent the sidewalls of said first slot to form extrinsic base regions adjacent the sidewalls of said first slot;
    (d) insulating said sidewalls of said first slot to electrically isolate said extrinsic base regions from said sidewalls of said first slot;
    (e) forming an active collector region in said substrate between said buried collector layer and the bottom of said first slot by implanting one or more doping agents into said substrate capable of forming said active collector region;
    (f) forming an active base region in an upper portion of said substrate beneath the bottom of said first slot and in electrical communication with said extrinsic base region by implanting one or more doping agents into said substrate capable of forming said active base region;

(g) forming at least one additional slot parallel to said first slot and communicating with said buried collector layer to provide electrical contact through said buried collector layer with said active collector region;

(h) forming an emitter region in said first slot over said active base region; and (i) forming base contact regions on the surface of said structure and in electrical communication with said extrinsic base regions.

10. The method of claim 9 wherein said steps of forming said active base region and said active collector region further include diffusing said implanted doping agents into said substrate.

11. A method of making an improved bipolar transistor in a slot in the substrate of an integrated circuit structure having a buried collector layer therein which comprises:

(a) forming a first substantially vertical slot in a substrate of an integrated circuit structure having a depth less than said buried collector layer;

(b) doping the sidewalls of said slot to form an extrinsic base region in said substrate adjacent said sidewalls of said first slot;

(c) forming an insulating layer over the sidewalls of said first slot to insulate said slot from said extrinsic base region formed in said substrate adjacent said slot;

(d) forming an active collector region in said substrate beneath the bottom of said first slot extending to said buried collector layer;

(e) forming an active base region in said substrate in a portion of said active collector region formed beneath the bottom of said slot, said active base region being formed in contact with said extrinsic base region;

(f) providing electrical contact means to said active collector region by forming a collector contact slot in said substrate spaced from said first slot and extending down to said buried collector layer;

(g) forming an emitter region in said first slot over said active base region; and (h) forming base contact regions on the surface of said structure and in electrical communication with said extrinsic base regions.

12. The method of claim 11 wherein said formation of said active base region beneath the bottom of said first slot and in electrical communication with said extrinsic base region in said substrate further comprises the steps of implanting a dopant into the collector region formed beneath the bottom of said first slot and then diffusing said implantation by annealing said structure to diffuse said dopant.

13. A method of making an improved bipolar transistor in a slot in a silicon substrate of an integrated circuit structure which comprises:

(a) forming a buried collector layer in said structure;

(b) forming an epitaxial silicon layer over said buried collector layer;

(c) forming a first masking layer over said substrate having an opening therein;

(d) forming a polysilicon layer over said first mask;

(e) forming a second mask having openings therein defining the latent image of an emitter-base-collector slot and a collector contact slot, said opening for said emitter-base-collector slot being formed over said opening in said first masking layer;

(f) etching said polysilicon layer through said second mask to form a portion of said emitter-base-collector and collector contact slots, said collector contact slot terminating at said first mask layer beneath said polysilicon layer;

(g) further etching said epitaxial silicon beneath said polysilicon layer through said first and second masks to form said emitter-base-collector slot, having a depth less than the depth of said buried collector layer;

(h) doping said substrte adjacent the side-walls of said emitter-base-collector slot to form an extrinsic base region adjacent the sidewalls of said emitter-base-collector slot;

(i) insulating said sidewalls of said emitter-base-collector slot to electrically isolate said extrinsic base region from said sidewalls of said emitter-base-collector slot;

(j) doping said substrate through the bottom of sid emitter-base-collector slot to form an active collector region in said substrate between said buried collector layer and the bottom of said emitter-base-collector slot by implanting one or more doping agents into said substrate capable of forming said active collector region;

(k) forming an active base region in an upper portion of said substrate beneath the bottom of said first slot by implanting one or more doping agents into said substrate capable of forming said active base region;

(l) annealing said implanted collector and active base regions to diffuse said dopants and to form contact between said active base region and said extrinsic base region in said substrate;

(m) forming an emitter region in said emitter-base-collector slot over said active base region by filling said slot with doped polysilicon;

(m) forming insulating oxide portions over the exposed edges of said polysilicon layer in said collector contact slot;

(n) removing said first mask layer at the bottom of said collector contact slot;

(o) etching said collector contact slot in said silicon substrate down to said buried collector layer;

(p) insulating the sidewalls of said collector contact slot by oxidizing the exposed silocon substrate;

(q) filling said collector contact slot with polysilicon; and (r) forming base contact regions on the surface of said structure and in electrical communication with said extrinsic base regions.

* * * * *